(12) United States Patent
Distler et al.

(10) Patent No.: US 9,766,306 B2
(45) Date of Patent: Sep. 19, 2017

(54) SETTING APPARATUS

(71) Applicants: Peter Distler, Möhrendorf (DE); Peter Kasper, Seon (CH); Bernd Maciejewski, Markt Erlbach (DE); Ingo Schmidt, Weisendorf (DE)

(72) Inventors: Peter Distler, Möhrendorf (DE); Peter Kasper, Seon (CH); Bernd Maciejewski, Markt Erlbach (DE); Ingo Schmidt, Weisendorf (DE)

(73) Assignee: Siemens Aktiengesellschaft, München (DE)

( * ) Notice: Subject to any disclaimer, the term of this patent is extended or adjusted under 35 U.S.C. 154(b) by 760 days.

(21) Appl. No.: 14/155,958

(22) Filed: Jan. 15, 2014

(65) Prior Publication Data

US 2014/0197838 A1    Jul. 17, 2014

(30) Foreign Application Priority Data

Jan. 15, 2013   (DE) .................... 10 2013 200 500

(51) Int. Cl.
*G01V 3/00* (2006.01)
*G01R 33/28* (2006.01)
*G01R 33/38* (2006.01)

(52) U.S. Cl.
CPC ......... *G01R 33/28* (2013.01); *G01R 33/3802* (2013.01)

(58) Field of Classification Search
CPC  G01R 33/543; G01R 33/5608; G01R 33/385; G01R 33/36; A61B 5/055
USPC ....................................................... 324/322
See application file for complete search history.

(56) References Cited

U.S. PATENT DOCUMENTS

| | | | |
|---|---|---|---|
| 6,203,179 B1 * | 3/2001 | Swanson | F21V 21/02 362/147 |
| 6,208,144 B1 | 3/2001 | McGinley et al. | |
| 6,794,871 B2 * | 9/2004 | Imai | A61B 5/0555 324/318 |
| 7,071,693 B2 | 7/2006 | Yasuhara | |
| 7,663,366 B2 | 2/2010 | Takamori | |

(Continued)

FOREIGN PATENT DOCUMENTS

| | | |
|---|---|---|
| CN | 101393254 A | 3/2009 |
| DE | 29515311 U1 | 1/1997 |

(Continued)

OTHER PUBLICATIONS

Korean Notice of Allowance for related Korean Application No. 10-2014-0003382, dated Feb. 24, 2016.

(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A setting apparatus configured for setting and/or adjusting an attachment position of an attachment element for attaching a housing cover of a magnetic resonance apparatus in relation to a magnetic center of a magnet unit is provided. The setting apparatus includes a base plate unit, an attachment unit for attaching the base plate unit to the magnet unit and a setting unit. The setting unit includes at least two laser beam units for marking the attachment position of the attachment element for attaching the housing cover to the magnet unit.

31 Claims, 7 Drawing Sheets

(56) References Cited

U.S. PATENT DOCUMENTS

| | | | |
|---|---|---|---|
| 2006/0220646 A1 | 10/2006 | Kurome et al. | |
| 2007/0069728 A1 | 3/2007 | Van Helvoort et al. | |
| 2007/0079430 A1 | 4/2007 | Herrera-Gurrola | |
| 2007/0164743 A1 | 7/2007 | Takamori | |
| 2009/0079430 A1* | 3/2009 | Yamashita | G01R 33/385 |
| | | | 324/318 |
| 2011/0306863 A1* | 12/2011 | Koshnitsky | A61B 5/0555 |
| | | | 600/407 |
| 2012/0068076 A1* | 3/2012 | Daghighian | A61B 6/037 |
| | | | 250/363.03 |
| 2012/0264614 A1 | 10/2012 | Distler et al. | |

FOREIGN PATENT DOCUMENTS

| | | |
|---|---|---|
| DE | 102011007179 A1 | 10/2012 |
| GB | 2149510 A | 6/1985 |
| JP | 6304152 A | 11/1994 |
| JP | 2007190200 A | 8/2007 |
| JP | 2009090101 A | 4/2009 |

OTHER PUBLICATIONS

Chinese Office action for related Chinese Application No. 2014 100 173 091, dated Jul. 22, 2015, with English Translation.
German Office action for related German Application No. 10 2013 200 500.8, dated Jul. 22, 2015, with English Translation.
Maciejewski B. et al: "Flexible Schablone zur Anzeichnung von Positionen bei Systemaufstellung".

* cited by examiner

SETTING APPARATUS

This application claims the benefit of DE 10 2013 200 500.8, filed on Jan. 15, 2013, which is hereby incorporated by reference in its entirety.

BACKGROUND

The present embodiments relate to a setting apparatus configured for setting and/or adjusting an attachment position of an attachment element for an arrangement of a housing cover of a magnetic resonance apparatus in relation to a magnetic center of a magnet unit.

With medical magnetic resonance apparatuses, there may be a discrepancy between a geometrical center and a magnetic center. Because of this condition and further system tolerances, the housing cover of a magnetic resonance apparatus is to be aligned to the magnetic resonance apparatus during installation according to an arrangement and/or positioning of a magnet unit (e.g., a radio-frequency antenna unit of the magnet unit), since the radio-frequency antenna unit is disposed within the magnet unit with respect to a magnetic center. This alignment of the housing cover according to an arrangement and/or positioning of the radio-frequency antenna unit is both for new installation of magnetic resonance apparatuses and also for system upgrades of magnetic resonance apparatuses already installed on customer premises.

Previously the individual attachment points of the housing cover were measured mechanically and/or adjusted along the three spatial axes using a measurement gauge and/or an installation gauge. This type of setting and/or adjustment of the attachment points of the housing cover on the magnet unit is, however, complicated and time-intensive. In addition, mechanically-stressable measurement gauges and/or installation gauges, as a result of a size used for the desired application and a torsional stress rigidity associated therewith, are expensive to procure.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an apparatus that provides a simple setting and/or adjustment of an attachment position of individual attachment elements for attaching a housing cover to a magnet unit is provided.

In one or more of the present embodiments, a setting apparatus that is embodied for setting and/or adjusting an attachment position of an attachment element for attaching a housing cover of a magnetic resonance apparatus in relation to a magnetic center of a magnet unit is provided.

The setting apparatus includes a base plate unit, an attachment unit for attaching the base plate unit to the magnet unit and a setting unit. The setting unit includes at least two laser beam units for marking and/or setting the attachment position of the attachment element for attaching the housing cover to the magnet unit. An attachment element for attaching the housing cover of the magnetic resonance apparatus may be understood as an attachment element of which the position is able to be set in relation to the magnet unit in at least one spatial direction (e.g., in at least two spatial directions or in three spatial directions). In one embodiment, for setting and/or positioning the attachment elements for attaching the housing cover, the setting apparatus is adapted to a geometry of a radio-frequency antenna unit of the magnet unit. The radio-frequency antenna unit (e.g., geometry of the radio-frequency antenna unit) is aligned to a magnetic center of a main magnet of the magnet unit. An attachment position may be a position of the attachment element on the magnet unit in which the attachment element makes possible an exact arrangement of the housing cover (e.g., an arrangement aligned at right angles in relation to a magnetic center of the magnet unit). Through one or more of the present embodiments, through the use of the at least two laser beam units, for example, a precise and exact alignment of the attachment elements and thereby of the housing cover in relation to the magnetic center of the magnetic resonance apparatus may be achieved. In addition, the setting apparatus may be embodied by the at least two laser beam units (e.g., compact and space-saving by comparison with conventional installation gauges), so that the setting apparatus may also be used on site at a customer's premises (e.g., during an upgrade of a previous magnetic resonance apparatus). For this purpose, the setting apparatus may be embodied independently (e.g., separately from the magnet unit). A low-cost setting apparatus may be achieved since the at least two laser beam units may be embodied with laser elements of laser class 1, and thus, in addition, a higher safety standard may be provided.

The setting unit includes a swing-arm unit, on which at least one of the at least two laser beam units is disposed. Advantageously, the swing-arm unit is supported pivotably with respect to the base plate unit around an axis of rotation. The axis of rotation is essentially aligned at right angles to a main extent surface of the base plate unit. In this way, a position of an attachment element may be marked easily by the setting apparatus and thus may be set and/or adjusted.

In a further embodiment, the swing-arm unit includes at least one latching element, and the base plate unit includes at least one latching element that corresponds to the at least one latching element of the setting unit. This enables a safe and non-slip positioning of the swing-arm unit in a latching position of the swing-arm unit in relation to the base plate unit to be achieved, so that the adjustment of the attachment position of the attachment element may be undertaken in a time-saving way.

It is advantageous that, for example, at least one latching element is disposed on the base plate unit such that, in a latching position, the swing-arm unit is aligned with the base plate unit such that the at least two laser beam units mark at least one attachment position of the attachment element. A simple positioning of the setting unit in relation to the base plate unit may be achieved for marking an attachment position. For this purpose, the base plate unit includes a number of latching elements for different latching positions of the setting unit in relation to the base plate unit. The swing-arm unit (e.g., the laser beam units in each latching position with the base plate unit) marks an attachment position of one of the attachment elements. The different positions of the attachment elements may also be disposed with respect to a front cover and a rear cover of the housing cover on the base plate unit so that a versatile use of the setting apparatus may be achieved.

A constructively-simple marking of an attachment position may be achieved if the at least two laser beam units (e.g., a first laser beam unit and a second laser beam unit) are disposed on the setting unit such that a first laser beam of the first laser beam unit, during operation of the setting apparatus, has a common crossing point with a second laser beam of the second laser beam unit. The common crossing point marks the attachment position of the attachment element.

In an advantageous development, the at least two laser beam units are disposed along a longitudinal extent of the swing-arm unit at different end areas of the swing-arm unit. In one embodiment, the swing-arm unit is embodied, for example, such that an axis of rotation of the swing-arm unit is disposed along a longitudinal extent of the swing-arm unit at a center of the swing-arm unit. The different attachment positions of the attachment elements may be marked, for example, by the two laser beam units by simply turning the swing-arm unit. In one embodiment, beam directions of laser beams of the two laser beam units are set to a distance of the attachment position from the center of the radio-frequency antenna unit. The laser beams of the laser beam units, together with the crossing point, span a surface that is aligned in parallel to the main extent surface of the base plate unit, so that an exact alignment of the attachment points relative to the base plate unit and thus to the magnet unit may be achieved. In one embodiment, the main extent surface of the base plate unit is aligned, for example, in parallel to an opening surface and/or a cross-sectional surface of the radio-frequency antenna unit.

As an alternative to this, the at least two laser beam units may be arranged in the same end area of the swing-arm unit. In one embodiment, the swing-arm unit is embodied such that an axis of rotation of the swing-arm unit is disposed along a longitudinal extent of the swing-arm unit in an end area of the swing-arm unit facing away from one of the laser beam units. The end area of the swing-arm unit has a web-shaped element disposed at right angles to the longitudinal extent of the swing-arm unit, on which at least one of the at least two laser beam units is disposed. This enables the crossing point to be surrounded by two sides of the swing-arm unit, so that a short setting path between the laser beam units and the crossing point is present. The laser beam units and the crossing point here span a surface that is essentially orthogonal to the main extent surface of the base plate unit.

A flexible setting apparatus may be achieved if the swing-arm unit is disposed removably on the base plate unit. For example, the swing-arm unit may be removed from the base plate unit for installation of the setting apparatus on the magnet unit.

In a further embodiment, the setting unit includes at least one setting element that is disposed on the attachment element. The setting element includes at least one optical light channel, through which at least one of the two laser beams of the laser beam units is guided for an adjustment and/or setting of the attachment position. In this way, a setting and/or adjustment of the attachment position in at least one spatial direction may be achieved. In one embodiment, a position of the attachment element in at least one direction is varied until such time when the optical light channel and the laser beam coincide.

The setting unit may include at least one setting element that is disposed on the attachment element for setting and/or adjusting the attachment position. The setting element is embodied in the form of a pin. This enables the setting element to be disposed easily on the attachment element for adjustment and/or setting of the attachment position in relation to the magnet unit.

A rapid adjustment and/or setting of the attachment position may be achieved if the setting element has at least one first adjustment element. The at least one first adjustment element, in an adjusted state, is disposed within a beam path of at least one of the laser beams of at least one of the laser beam units and/or at a crossing point of laser beams of the at least two laser beam units. An adjusted state may be the attachment element being disposed in an adjusted and/or corrected position in relation to the magnet unit or the magnetic field, respectively.

In one embodiment, the first adjustment element has a form and/or a color that is different from a form and/or a color of an area of the setting element surrounding the adjustment element. This enables a detection of a set and/or adjusted attachment position to be achieved for a user (e.g., an installer), in that, for example, a contrast between the adjustment element and an area surrounding the adjustment element is maximized. The adjustment element may, for example, include a slot, on the side of which pointing towards the laser beam units a film and/or paper imprinted with an adjustment cross is disposed, so that an exact marking of the attachment position may be detected by a user from both sides of the adjustment element.

A direct setting of the attachment position of the attachment element on the magnet unit may be achieved if the at least one setting element has at least one plug-in area. The plug-in area is disposed for adjusting the attachment position of the attachment element on the attachment element of the magnet unit. For a secure arrangement of the setting element on the attachment element, the plug-in area may also have an element for latching the position of the setting element on the attachment element.

In one embodiment, the setting element includes at least one further adjustment element for a horizontal and/or vertical adjustment of the setting element in relation to a surface spanned by one of the laser beams of the laser beam units. This enables the setting element to be advantageously brought into a correct initial position for the adjustment and/or setting of the attachment position on the attachment element so that measurement errors during the adjustment and/or setting of the attachment position of the attachment element for attaching the housing cover may be avoided. In addition, this enables manufacturing tolerances during the manufacturing of the magnet unit (e.g., during the positioning and/or arrangement of the attachment elements on the magnet unit) to be advantageously compensated for. The further adjustment element may, for example, be formed by a spirit level (e.g., a transparent plastic or glass tube filled with a liquid and an air or gas bubble).

The setting element includes at least one hinged joint unit for adjusting and/or aligning the setting element in relation to a surface spanned by the laser beams of the laser beam units. In one embodiment, the setting element (e.g., in a state disposed on the attachment element) may be easily brought into an ideal and/or correct initial position for the adjustment and/or setting of the attachment position.

In a development, the base plate unit includes at least one adjustment element for adjusting and/or setting a position and/or a beam direction of a positioning laser unit of the magnet unit, through which a multifunctional setting apparatus may be provided. This enables an alignment of a laser beam of the positioning laser unit to be advantageously adapted and/or set to a magnetic center of the magnet unit. The positioning laser unit of the magnet unit is embodied for an exact positioning and/or an exact position detection of a position of the patient during a magnetic resonance examination.

The adjustment element may include at least one adjustment surface. The at least one the adjustment surface is aligned for adjusting and/or setting the position and/or beam direction of the positioning laser unit at right angles in relation to a main extent surface of the base plate unit and/or to a weight force acting on the adjustment element in an assembled state of the setting apparatus. In this way, a measurement imprecision as a result of an undesired angle of inclination of a positioning laser beam of the positioning laser unit may be advantageously prevented.

In a further embodiment, the setting apparatus includes a further laser beam unit that is embodied for adjusting and/or setting a position of a patient support apparatus in relation to the magnet unit (e.g., to the radio-frequency antenna unit). In one embodiment, a positioning template for positioning the patient support apparatus exactly in relation to the radio-frequency antenna unit is aligned and/or positioned by the further laser beam unit. In one embodiment, the further laser beam unit emits a line laser beam during operation (e.g., a cross line laser beam).

The further laser beam unit is disposed pivotably on the base plate unit, so that when the further laser beam unit is not being operated, the further laser beam unit may be disposed in a particularly space-saving arrangement. In addition, this enables the further laser beam unit to be disposed protected from external stresses and/or effects.

In an advantageous development, the attachment unit includes at least one frame unit, on which the base plate unit is disposed and through which a stable setting apparatus for the setting and/or adjustment of an attachment position may be achieved. An area delimited and/or surrounded by the frame unit may cover at least 50% of a surface of the base plate unit.

The frame unit includes a polygonal shape, and at least one attachment device for attaching the setting apparatus to the magnet unit is disposed on at least two respective corner areas of the frame unit. An advantageous, safe attachment of the setting apparatus to the magnet unit (e.g., to the radio-frequency antenna unit) may be achieved. The attachment unit includes an attachment device for attaching the setting apparatus to the magnet unit at each corner area of the polygonal shape. In one embodiment, the setting apparatus is disposed in at least three corner areas on the magnet unit, or the setting apparatus includes three attachment areas with the magnet unit.

A safe and stable attachment of the setting apparatus to the magnet unit (e.g., to the radio-frequency antenna unit) may be achieved if at least two of the attachment devices of the attachment unit each have a clamping element. The two clamping elements are disposed in opposite side areas of the frame unit.

If the attachment unit includes at least one sliding block guide for transferring a clamping movement to the clamping elements, a simple-to-operate attachment unit for attaching the setting apparatus to the magnet unit (e.g., to the radio-frequency antenna unit) may be provided. In one embodiment, the sliding block guide is disposed together with the frame unit on a side of the base plate unit facing away from the setting unit, so that a disruption and/or hindrance of an adjustment process of the attachment position of the attachment element through an arrangement and/or extension of the attachment unit is prevented.

The at least two clamping elements perform a clamping movement along a distance between the two clamping elements using the sliding block guide, through which a safe attachment of the setting apparatus to the magnet unit may be provided. In one embodiment, the sliding block guide includes an actuation unit for actuation of the sliding block by an operator. A movement of the actuation unit causes a movement of the sliding block guide (e.g., of the clamping elements aligned orthogonally thereto). In a closed state of the sliding block guide, a distance between the two clamping elements of the attachment unit may assume a minimum value, and in an open state of the sliding block guide, the distance between the two clamping elements of the attachment unit may assume a maximum value. If in addition the two clamping elements are embodied in a hook shape, a grip on a part area of the magnet unit (e.g., the radio-frequency antenna unit) using the clamping elements is made possible during an attachment process of the setting apparatus to the magnet unit.

In a further embodiment, the attachment unit includes at least two securing elements that are embodied for a screw connection between the setting apparatus and the magnet unit, through which the setting apparatus may be latched on to the magnet unit (e.g., the radio-frequency antenna unit). In this way, a precise and exact adjustment and/or setting of the attachment position of the attachment element for attaching the housing cover to the magnet unit may also be advantageously achieved, in that an undesired change in the position of the setting apparatus may be prevented during the process of adjusting and/or setting the attachment position. An exact arrangement and/or centering of the setting apparatus on the magnet unit (e.g., on the radio-frequency antenna unit of the magnet unit) may be achieved by this method.

The attachment unit may include at least two support elements that each have a support surface that is disposed at right angles to a clamping surface of a clamping element, through which a safe positioning of the setting apparatus on the magnet unit (e.g., on the radio-frequency antenna unit) may be achieved during an attachment of the setting apparatus to the radio-frequency antenna unit. In addition a positioning process of the setting apparatus on the magnet unit (e.g., on the radio-frequency antenna unit) may be simplified to the extent that the at least one part area of a weight force acting on the setting apparatus may be dissipated by the support elements on the magnet unit, and in this way, simple handling and/or operability of the setting apparatus may be achieved for the user. The support elements in this case extend away from the frame unit in the form of bars, so that the setting apparatus may be supported in an advantageous, precisely-defined attachment position on the radio-frequency antenna unit for attaching the setting apparatus to the radio-frequency antenna unit. In this regard, a right-angled arrangement of the support surface in relation to the clamping surface may, for example, a right-angled arrangement with, for example, a tolerance range of ±20°, a tolerance range of ±12°, or a tolerance range of ±6°.

If at least one of the securing elements and/or one of the support elements are disposed in each case in a corner area of the frame unit in which one of the clamping elements is disposed, a compact setting apparatus may be provided.

In an advantageous development, the attachment unit includes at least one further attachment device that is disposed in at least a third corner area of the frame unit, through which a stable arrangement of the setting apparatus on the magnet unit (e.g., on the radio-frequency antenna unit) for an adjustment and/or setting of the attachment position of the attachment element for attaching the housing cover to the magnet unit may be achieved. Measurement imprecisions resulting from undesired bending moments acting on the setting apparatus may be prevented through this.

One or more of the present embodiments are based on a magnetic resonance apparatus with a magnet unit having a main magnet, a gradient coil unit, a radio-frequency antenna unit and at least one attachment element, a housing cover surrounding the magnet unit, and a setting apparatus for setting and/or adjusting an attachment position of the attachment element for attaching the housing cover to a magnet unit. A precise and exact alignment of the housing cover in relation to the magnetic center of the magnetic resonance apparatus may be achieved. In addition, the setting apparatus may be embodied compact and space-saving using the at least two laser beam units compared to conventional installation gauges, so that the setting apparatus may also be used on site at a customer premises (e.g., during an upgrade to an existing magnetic resonance apparatus).

The at least one attachment element may also include at least one setting element for setting an attachment position of the attachment element in at least one direction. This enables a flexible and rapid setting and/or adjustment of the attachment position of the attachment element on the magnet unit to be achieved. In one embodiment, the attachment element includes a number of setting elements for setting a position of the attachment element in at least two (e.g., at least three) directions.

DETAILED DESCRIPTION

Figure 1:
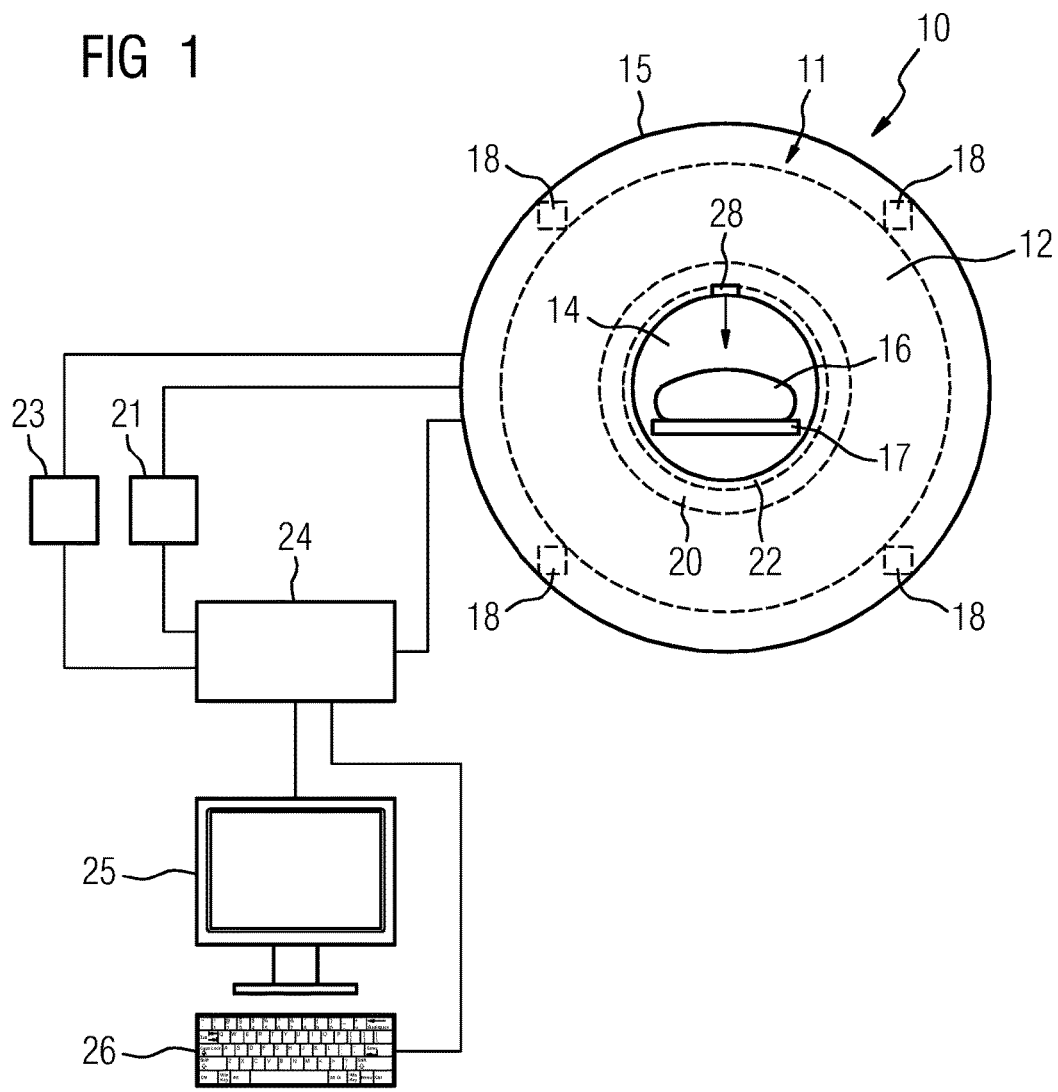
FIG. 1 shows one embodiment of a magnetic resonance apparatus with a housing cover and a magnet unit.

FIG. 1 shown one embodiment of a magnetic resonance apparatus 10. The magnetic resonance apparatus 10 includes a magnet unit 11 with a main magnet 12 for generating a strong and, for example, constant main magnetic field. In addition, the magnetic resonance apparatus 10 has a cylindrical imaging area 14 for recording an image of the patient 16. The imaging area 14 is surrounded in a circumferential direction by a housing cover 15 of the magnetic resonance apparatus 10 surrounding the magnet unit 11 in a cylindrical manner. The patient 16 may be pushed by a patient support apparatus 17 of the magnetic resonance apparatus 10 into the imaging area 14. For this purpose, the patient support apparatus 17 is disposed movably within the magnetic resonance apparatus 10.

Figure 2:
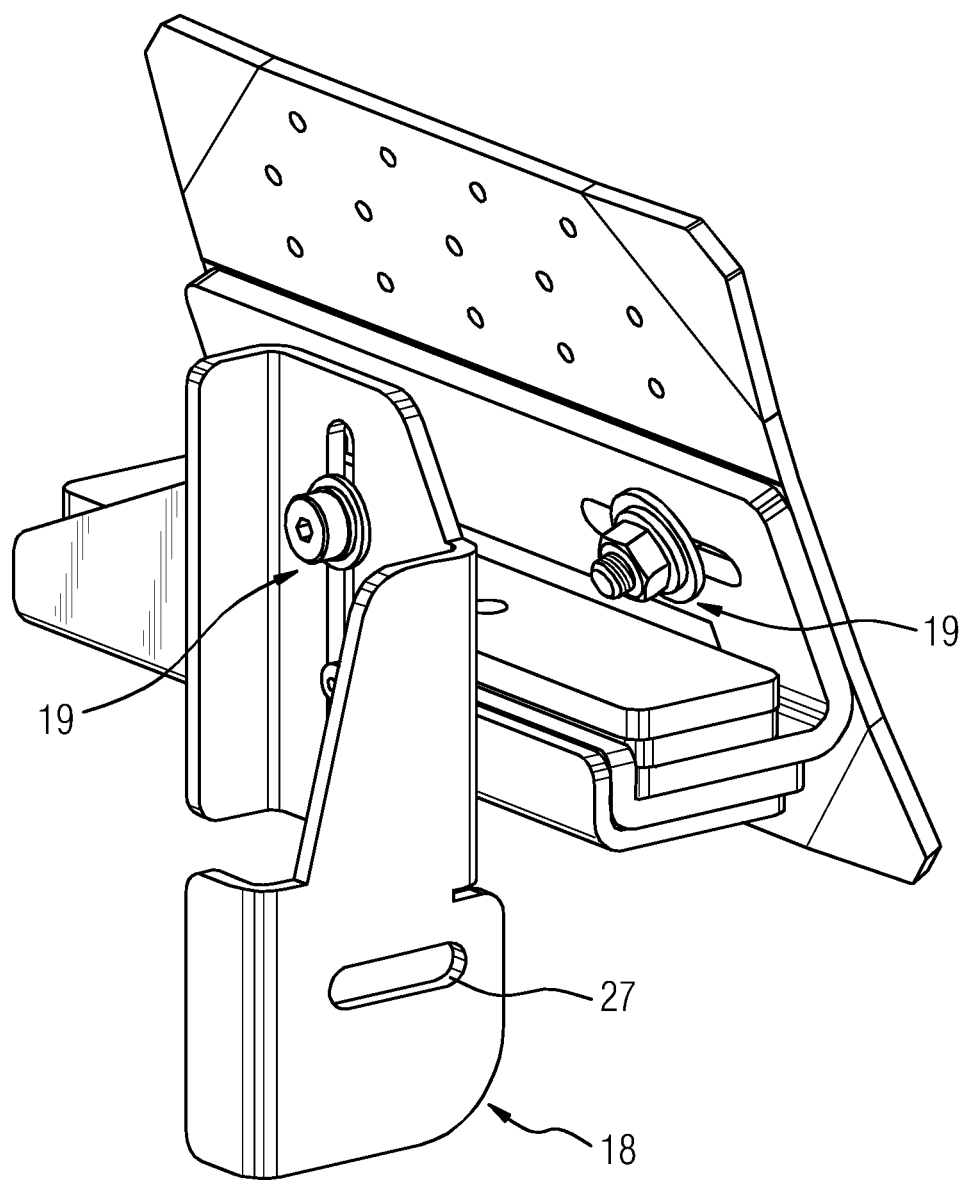
FIG. 2 shows a detailed view of one embodiment of an attachment element of the magnet unit.

To attach the housing cover 15 of the magnet unit 11 (e.g., for a front side and/or a rear side of the magnet unit 11), the magnet unit 11 has attachment elements 18, which are disposed in an edge area of the magnet unit 11 (e.g., in an edge area of a housing unit of the main magnet 12). A positioning of the housing cover 15 is oriented to a magnetic center of the magnet unit 11. For adjustment and/or setting of the exact attachment position of the housing cover 15 to the magnet unit 11, the individual attachment elements 18 each have setting elements 19 for setting a position of the respective attachment elements in at least two spatial directions on the magnet unit (FIG. 2).

The magnet unit 11 also has a gradient coil unit 20 for generating magnetic field gradients. The magnetic field gradients are used for spatial coding during imaging. The gradient coil unit 20 is controlled by the gradient control unit 21. The magnet unit 11 further includes a radio-frequency antenna unit 22 and a radio-frequency antenna control unit 23 for exciting a polarization that is established in the main magnetic field 13 generated by the main magnet 12. The radio-frequency antenna unit 22 is controlled by the radio-frequency antenna control unit 23 and sends radio-frequency magnetic resonance sequences into an examination space that is essentially formed by the imaging area 14.

For controlling the main magnet 12 of the gradient control unit 21 and for controlling the radio-frequency antenna control unit 23, the magnetic resonance apparatus 10 has a control unit 24 formed by a computation unit. The control unit 24 centrally controls the magnetic resonance apparatus 10 (e.g., carrying out a predetermined imaging gradient echo sequence). In addition, the control unit 24 includes an evaluation unit for evaluating image data. Control information, such as imaging parameters, for example, and also reconstructed magnetic resonance images, may be displayed on a display unit 25 (e.g., on at least one monitor of the magnetic resonance apparatus 10) for an operator. The magnetic resonance apparatus 10 also has an input unit 26 by which information and/or parameters may be entered by an operator during a measuring process.

The magnetic resonance apparatus 10 shown may include further components that magnetic resonance apparatuses 10 may feature. The way in which a magnetic resonance apparatus 10 may function is also known to the person skilled in the art, so that a more detailed description of the general components is not provided.

Figure 3:
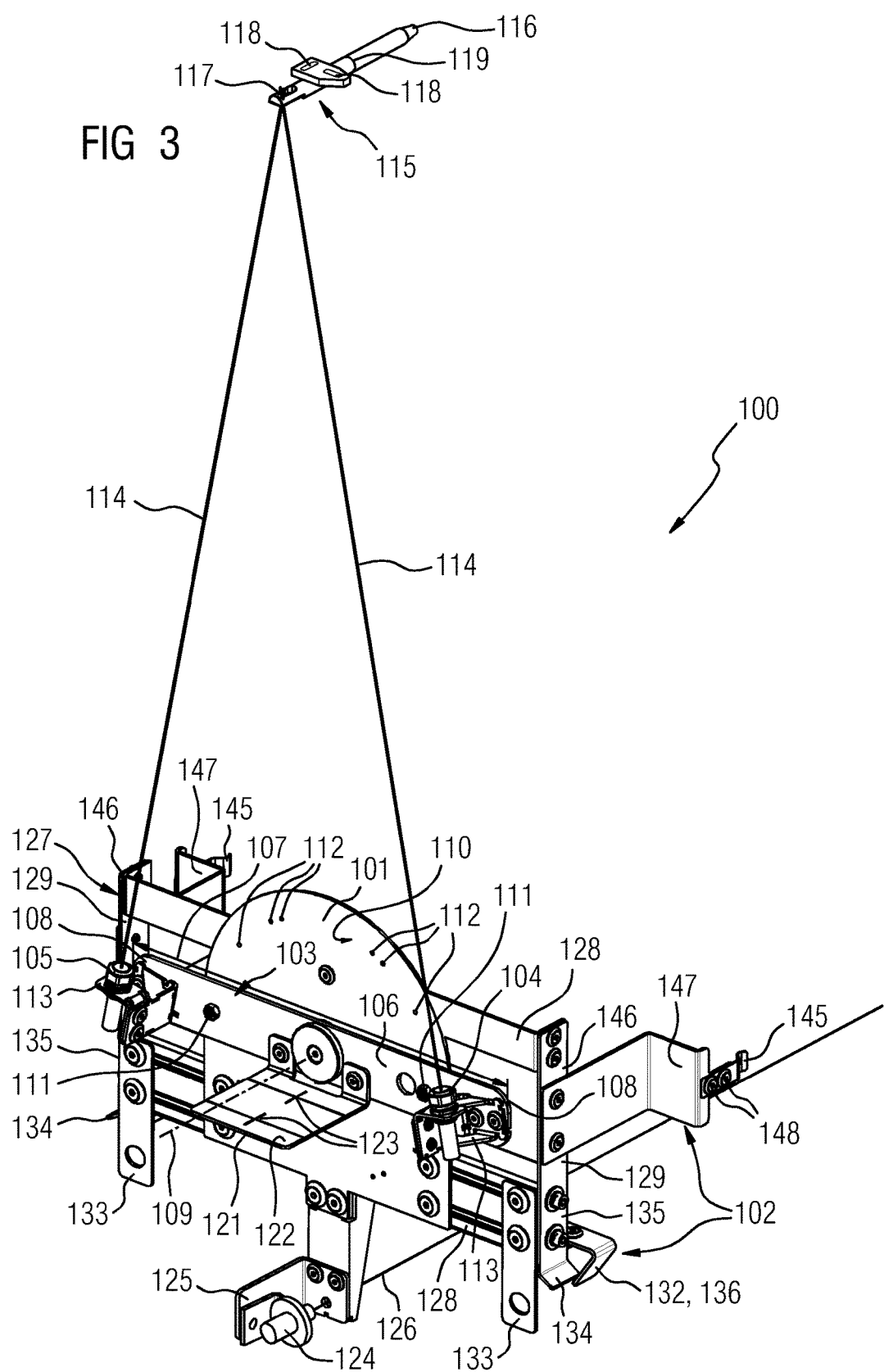
FIG. 3 shows one embodiment of a setting apparatus.

For setting and/or adjusting an attachment position of the attachment elements 18, the magnetic resonance apparatus 10 includes a setting apparatus 100. FIG. 3 shows one embodiment of the setting apparatus for setting and/or attaching an attachment position of the attachment elements 18 for attaching the housing cover 15 in relation to a magnetic center of the magnet unit 11. The setting apparatus 100 includes a base plate unit 101, an attachment unit 102 and a setting unit 103.

The setting unit 103 includes two laser beam units 104, 105 for marking the attachment position of the attachment elements 18 for attaching the housing cover 15 to the magnet unit 11. The setting unit 103 has a swing-arm unit 106 on which the two laser beam units 104, 105 are disposed. The two laser beam units 104, 105 are disposed along a longitudinal extent 107 of the swing-arm unit 106 in different, opposite end areas 108 on the swing-arm unit 106. For this purpose, bar elements 113 are disposed in each case in the end areas 108 of the swing-arm unit 106, which extend outwards on a side of the swing-arm unit facing away from the base plate unit 101. The two laser beam units 104, 105 are disposed on the swing-arm unit 106 or on the bar elements 113 of the swing-arm unit 106 such that, during operation of the laser beam units 104, 105, the two laser beams 114 form a common crossing point. The common crossing point marks the attachment position of the attachment element 18 for attaching the housing cover 15 to the magnet unit 11. The attachment position is marked by the laser beam units initially in an x/y plane of the magnet unit, which is aligned in parallel to the main extent surface 110 of the base plate unit 101. The attachment position in a z direction, which is aligned orthogonally to the x/y plane, is marked by a setting element, as is shown in the description for FIGS. 4 and 8. The two laser beams 114 of the two laser beam units 104, 105 span a surface that is aligned essentially in parallel to the main extent surface 110 of the base plate unit 101. The surface spanned by the two laser beams 114 is aligned in parallel to the main extent surface 110 of the base plate unit 101 (FIG. 3) in order to avoid imprecisions in the marking of the attachment positions.

The swing-arm unit 106 is supported on the base plate unit 101 so as to be able to be pivoted around an axis of rotation 109. The axis of rotation 109 is aligned at right angles to the main extent surface 110 of the base plate unit 101. For pivoted support of the swing-arm unit 106 on the base plate unit 101, the setting unit 103 has a pivot bush element not shown in any greater detail, which is disposed in a center along the longitudinal extent 107 of the swing-arm unit 106. The swing-arm unit 106 is supported on the base plate unit 101 in this case such that the swing-arm unit 106 rests directly on the base plate unit 101 or is supported at a distance of a maximum of 3 mm from the base plate unit 101.

The base plate unit 101 has a semicircular shaped part area and a rectangular part area. The base plate unit 101 is configured in one piece from the two-part areas. The semicircular shaped part area has a center around which the part area extends in the shape of the semicircle with the radius r. Disposed in the center of this is the pivotable support element for supporting the swing-arm unit 106.

For a secure disposal of the swing-arm unit 106 in different marking positions, the swing-arm unit 106 has two latching elements 111 that in the present exemplary embodiment include a spring-loaded ball not shown in any greater detail. The latching elements 111 are each supported in a recess of the swing-arm element 106. The spring-loaded ball is disposed in an area of the swing-arm unit 106 facing towards the base plate unit 101. The spring-loaded ball protrudes beyond the swing-arm unit 106. The base plate unit 101 has latching elements 112 corresponding to the latching elements 111 of the swing-arm unit 106. The latching elements 112 of the base plate unit 101 are formed by recesses that are disposed on an imaginary semicircular line around the center of the base plate unit 101. The individual latching elements 112 are disposed on the base plate unit 101 such that, in a latching position of the swing-arm unit 106 with the base plate unit 101, the laser beams, during operation of the two laser beam units 104, 105, mark an attachment position for the attachment element 18. In addition, the different latching elements 112 are labeled with the marking position to be set for the attachment element 18 concerned. The latching elements 112 are also disposed in an edge area of the base plate unit 101 for maximum stability of the setting apparatus 100 of the magnet unit.

As an alternative to this, the swing-arm unit 106 together with the base plate unit 101 may also be embodied such that the attachment position of the attachment elements 18 may be set and/or adjusted even without latching elements. For this purpose, the pivotable support element for pivotably supporting the swing-arm element 106 on the base plate unit 101 may include an eccentric pivotable support element. In addition, in one embodiment, the individual laser beam units 104 105 may be supported movably in relation to the swing-arm unit 106 along a longitudinal extent of the swing-arm unit 106. Support of the swing-arm unit 106 in relation to the base plate unit 101 by a sliding block guide may also be provided. The individual setting positions of the swing-arm unit 106 in relation to the base plate unit 105 for setting and/or adjusting the attachment position of the attachment elements 18 may be set by the sliding block unit.

Figure 4:
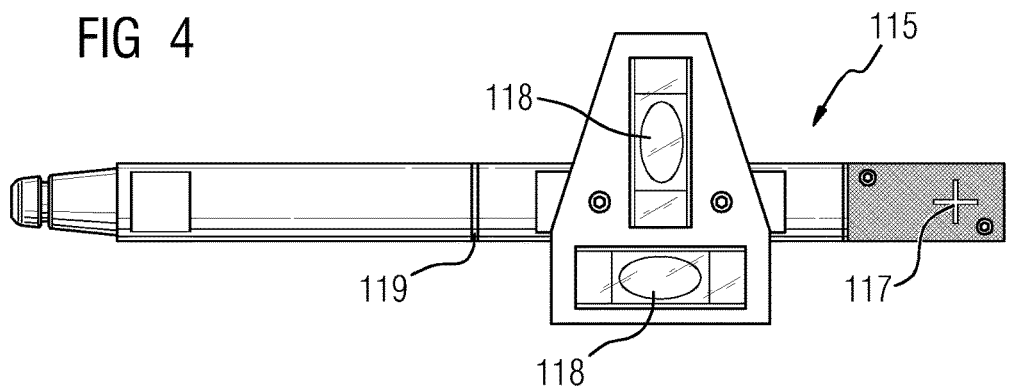
FIG. 4 shows a first exemplary embodiment of a setting element of the setting apparatus.

The setting apparatus 100 also includes a setting element 115 that is disposed for setting and/or adjusting the attachment position of the attachment element 18 on the magnet unit (FIGS. 3 and 4). The setting element 115 is embodied in the present exemplary embodiment in the shape of a pin and has a plug-in area 116 that is disposed along a longitudinal extent of the setting element 115 at a first end area of the setting element 115. The setting element 115 is disposed on the attachment element 18 using the plug-in area 116 in a receiving area 27 of the attachment element 18.

In an end area of the setting element 115 opposite the plug-in area 116, the area has a first adjustment element 117. Thus, the adjustment element 117 marks a point at which, when the setting element 115 is arranged in a correct attachment position of the attachment element 18, the two laser beams 114 of the laser beam units 104, 105 are to strike the element. In the present exemplary embodiment, the first adjustment element 117 is formed by an adjustment cross stamped and/or milled into the setting element 115. Alternative embodiments of the first adjustment element 117 may be provided. An area of the setting element 115 surrounding the adjustment element 117 also has a dark (e.g., a black) coating for maximum contrast between the adjustment element 117 and an area surrounding the adjustment element.

For a correct arrangement of the setting element 115 on the attachment element 18 or within a receiving area of the attachment element 18, the setting element 115 has a further adjustment element 118, as is shown in FIG. 4. The further adjustment element 118 makes possible a correct alignment of the setting element 115 in relation to a surface spanned by one of the two laser beams 114 of the two laser beam units 104, 105 and/or in relation to the main extent surface 110 of the base plate unit 101. In FIG. 4, the setting element 115 has two further adjustment elements 118 for this purpose, which are each formed by a spirit level. The two second adjustment elements 118 (e.g., the two spirit levels) are additionally aligned at right angles to one another. The setting element 115 for correct setting and/or adjustment of the arrangement on the attachment element 18 has a joint unit 119 that divides the setting element 115 into two part areas along a longitudinal extent. A first part area includes the plug-in element 116 and is disposed on the attachment element 18. A second part area includes the first adjustment element 117 and also the second adjustment element 118. Using the joint unit 119, an inclination may be set between the first part area and the second part area of the setting element 115 until the second part area (e.g., a surface of the second part area facing towards one of the laser beam units 104, 105) assumes a correct right-angled arrangement in relation to the surface spanned by the two laser beams 114 of the two laser beam units 104, 105 and/or in relation to the main extent surface 110 of the base plate unit 101. The joint unit 119 in the present exemplary embodiment includes a pivot joint. The pivot joint is set so that a friction force during a rotation is greater than the weight force acting on the second part area, so that autonomous rotation around an axis of rotation of the joint unit 119 is prevented.

In one embodiment, the setting element 115 may be provided without a joint unit 119 and without a further adjustment element.

The setting apparatus 100 from FIG. 3 also has an adjustment element 121 for adjusting and/or setting a position and/or a beam direction of a positioning laser unit 28 of the magnet unit 11 (FIG. 1). The positioning laser unit 28 is intended to detect an exact position of the patient 16 on the patient support device 17 during a magnetic resonance examination. The positioning laser unit 28 is integrated into a housing cover 15 facing towards the receiving area 14 of the magnetic resonance apparatus 10.

The adjustment element 121 is disposed on the swing-arm unit 106 in a central area. The adjustment element 121 has a web-shaped area that, in the present exemplary embodiment, is screwed to the swing-arm unit 106. Further types of attachment between the adjustment element 121 and the swing-arm unit 106 may also be provided. As an alternative, the adjustment element 121 may also be embodied in one piece with the swing-arm unit 106.

The adjustment element 121 also has a plate-shaped part area with an adjustment surface 122. The adjustment surface 122 is aligned at right angles to the main extent surface 110 of the base plate unit 101. In an adjustment position of the setting apparatus 100, the adjustment surface 122 is also disposed at right angles to the surface spanned by the two laser beams 114 of the two laser beam units 104, 105 and/or at right angles to the main extent surface 110 of the base plate unit 101. The adjustment surface in the present exemplary embodiment has two adjustment markings 123. The two adjustment markings 123 are each formed by an adjustment cross. A first adjustment cross of the two adjustment crosses is provided for setting a position and/or alignment of a laser beam direction of the positioning laser units disposed on the rear side of the magnet unit 11, and a second adjustment cross of the two adjustment crosses is intended for setting a position and/or alignment of a laser beam direction of the positioning laser unit 28 disposed on the front side of the magnet unit 11. The two adjustment crosses may be stamped into, milled into, printed onto the adjustment surface and/or attached to the adjustment surface 122 by further methods. To adjust and/or align the position and/or the alignment of the laser beam direction of the positioning laser unit 28, the swing-arm unit 106 is disposed in a horizontal position. In the horizontal position of the swing-arm unit 106, a longitudinal extent of the swing-arm unit 106 is aligned at right angles to the main extent surface 110 of the base plate unit 101 and also at right angles to the surface spanned by the two laser beams 114 of the two laser beam units 104, 105.

As an alternative to this, the adjustment element 121 may also be disposed on the base plate unit 101. The adjustment element 121 may be disposed removably on the base plate unit 101 in order not to impede a rotational movement of the swing-arm unit 106. In addition, the swing-arm unit 106 may also be disposed removably on the base plate unit 101 for this purpose in order to also avoid disruptions and/or hindrances to the setting and/or adjustment of the positioning laser unit by the adjustment element 121.

Figure 5:
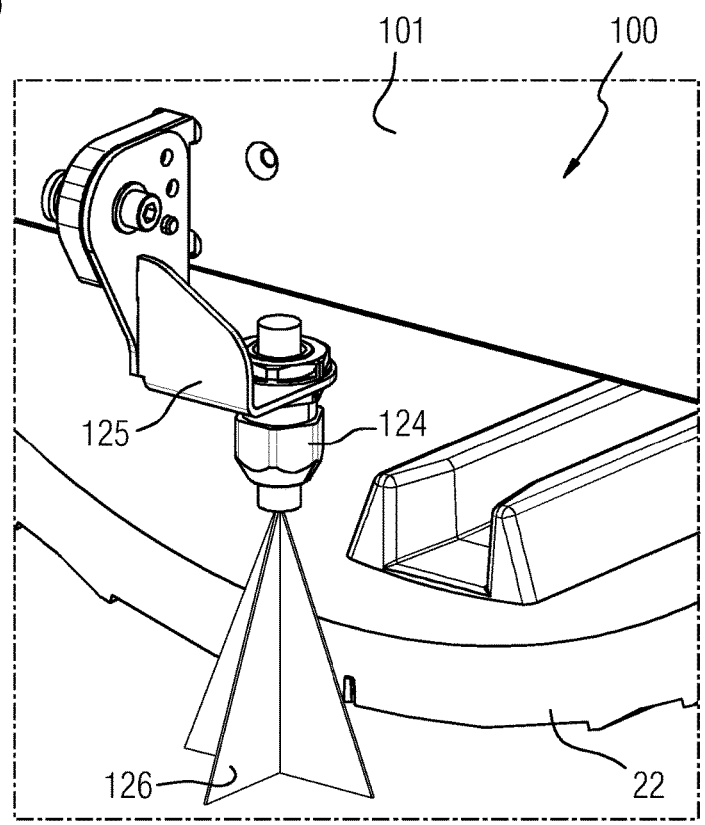
FIG. 5 shows a detailed view of one embodiment of a further laser beam unit of the setting apparatus.

The setting apparatus 100 additionally has a further laser beam unit 124 that is embodied for adjusting and/or setting a position of the patient support device 17 in relation to the magnet unit 11 (FIGS. 3 and 5). The further laser beam unit 124 is disposed on the rectangular part area of the base plate unit 101. For this purpose, the setting apparatus 100 has a further L-shaped holder element 125 that is disposed on the rectangular part area of the base plate unit 101. Disposed pivotably and/or hingeably on this L-shaped holder element 125 is the further laser beam unit 124. The further laser beam unit 124 is supported pivotably and/or hingeably between two positions (e.g., an operating position (FIG. 5) and a park position (FIG. 3). For this purpose, the setting apparatus 100 has a further pivot support unit not shown in any greater detail. In addition, the setting apparatus 100 may have further latching elements for this purpose, which secure the further laser beam unit 124 in the two positions. The further latching elements may be embodied similarly to the latching elements 111.

In an installed state of the setting apparatus 100 on the magnet unit 11, the further laser beam unit 124 is disposed in an operating position on the base plate unit 101 (e.g., on the L-shaped holder element 125), such that the laser beam 126 of the further laser beam unit 124 in an operating state is aligned in parallel to the main extent surface 110 of the base plate unit 101 (FIG. 5). In the operating state, the further laser beam unit 124 is intended for setting and/or adjusting the position of the patient support apparatus 17. The positioning of the patient support apparatus may be undertaken by a positioning template. The laser beam 126 of the further laser beam unit 124 includes, for example, a line laser beam (e.g., a cross line laser beam) for simple and exact positioning of the positioning template.

In the park position, the further laser beam unit 124 is disposed on the L-shaped holder element 125 such that the laser beam 126 of the further laser beam unit 124 is aligned essentially at right angles to the main extent surface of the base plate unit 101 (FIG. 3). The park position of the further laser beam unit 124 is formed by a non-active position of the further laser beam unit, in which a setting and/or adjustment of the position of the patient support facility 17 is not possible.

The individual laser beam units 104, 105, 124 of the setting apparatus 100 each include an energy storage device (e.g., a battery; not shown in any greater detail) that is integrated within the laser beam units 104, 105, 124 or is disposed within an area accommodating the laser beam units 104, 105, 124. As an alternative, a supply of energy to the laser beam units 104, 105, 124 by a power cable connection may also be provided.

Figure 6:
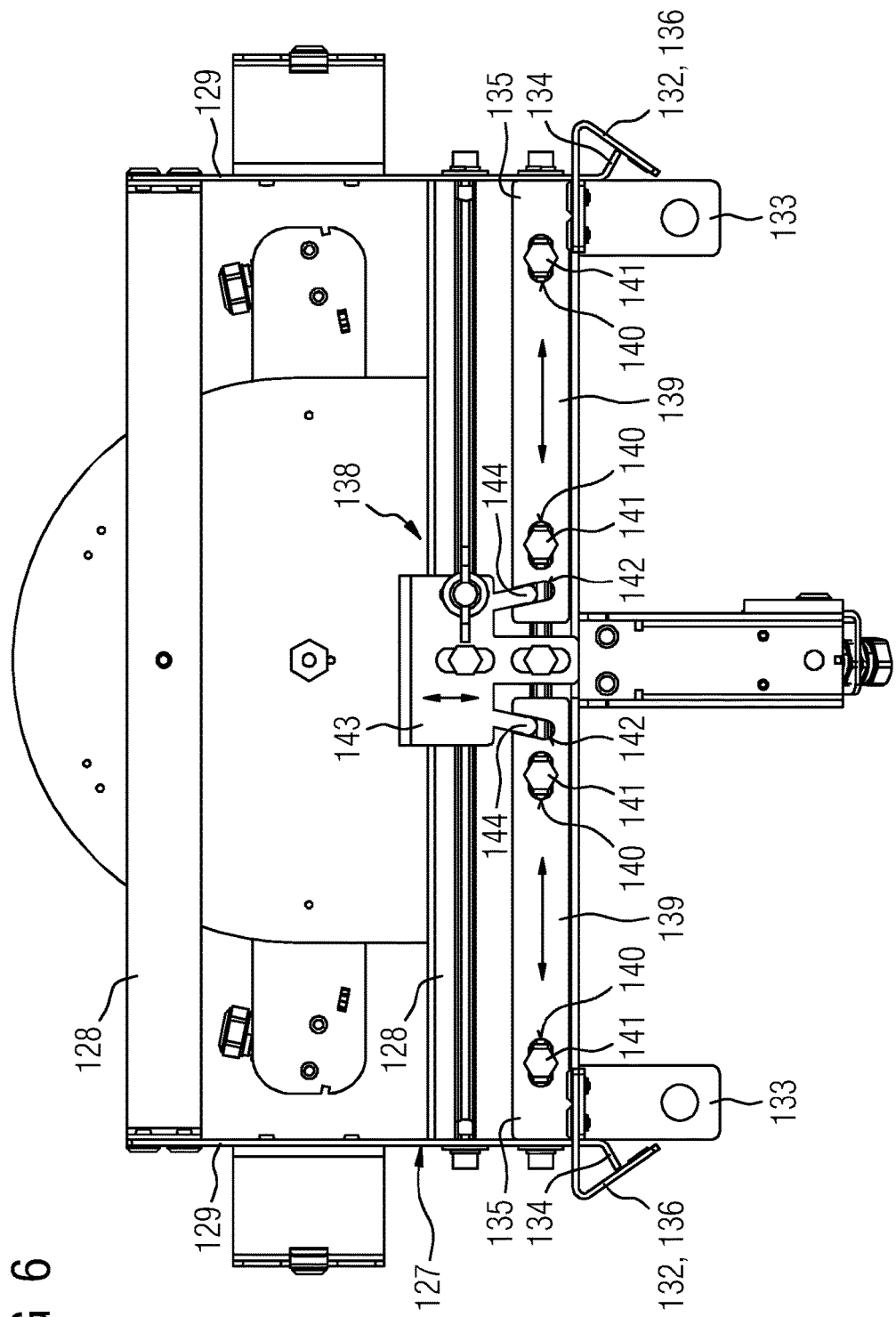
FIG. 6 shows a rear view of one embodiment of the setting apparatus with an attachment unit.
Figure 7:
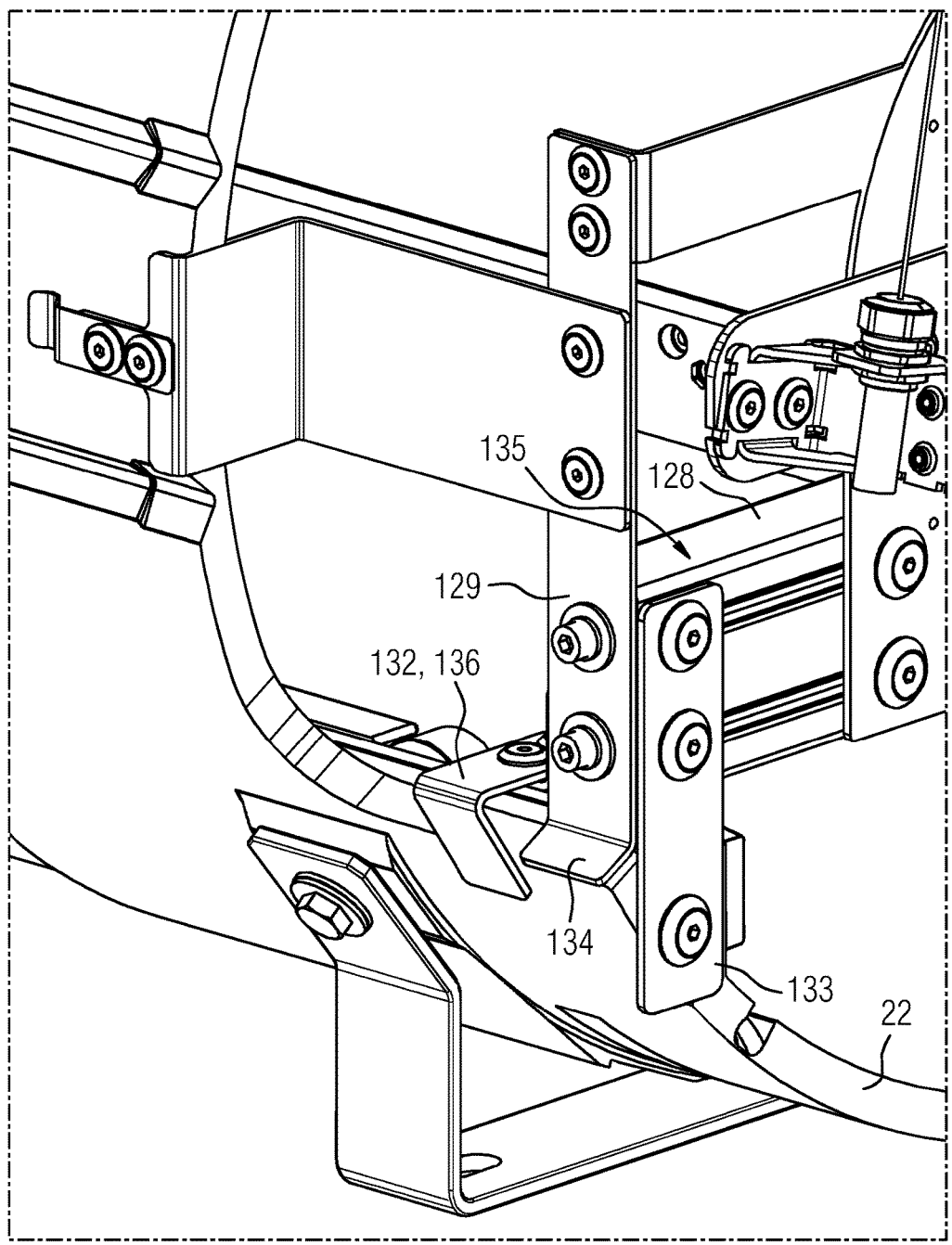
FIG. 7 shows a detailed view of an exemplary corner area of the attachment unit.

The attachment unit 102 of the setting apparatus 100 has a frame unit 127 (FIGS. 3, 6 and 7). The frame unit 127 in the present exemplary embodiment includes two longitudinal bar elements 128 that are disposed in parallel to one another. The frame unit 127 has two transverse bar elements 129 that are disposed in parallel to one another. The two transverse bar elements 129 are essentially disposed at right angles to the longitudinal bar elements 128, and together with the two longitudinal bar elements 128, form a polygonal (e.g., a rectangular frame unit 127 with a polygonal (e.g., rectangular) surface). The surface of the frame unit 127 covers at least 50% of the main extent surface 110 of the base plate unit 101. In the end area of the longitudinal bar elements 128, the longitudinal bar elements 128 are connected to an end area of the transverse bar elements, respectively. At least one of the longitudinal bar elements 128 embodied in the present exemplary embodiment has an aluminum profile strip. This longitudinal bar element 128 is disposed in an edge area of the rectangular part area on the base plate unit 101 facing away from the semicircular-shaped part area. As an alternative to this, the longitudinal bar element 128 may also have an embodiment other than an aluminum profile strip. The frame unit 127 is disposed on the base plate unit 101 on a side of the base plate unit 101 facing away from the setting unit 102.

In two corner areas 135 of the frame unit 127 on which the longitudinal bar element 128 embodied as an aluminum profile strip is connected to the transverse bar elements 129, the frame unit 127 has an attachment device 132 in each case for attaching the setting apparatus 100 to the magnet unit 11, a securing element 133 and a support element 134 (FIGS. 6 and 7). The attachment device 132 disposed in the corner areas 135 is formed by a clamping element 136. The securing element 133 includes at least one recess for accepting a screw element, so that, in a state in which the setting apparatus 100 is disposed on the magnet unit 11, the setting apparatus 100 may be screwed to the magnet unit 11. In addition, the securing element 133 has a stop surface that stops an insertion movement of the setting apparatus 100 into the magnet unit 11 (e.g., into the radio-frequency antenna unit 22), so that the setting apparatus 100 will be disposed at a correct distance from the magnet unit 11 (e.g., the radio-frequency antenna unit 22) for the setting and/or adjustment of the attachment position of the attachment element 18. The stop surfaces of the securing elements 133 each have at least one recess for accepting the screw element. The securing elements 133 or the stop surfaces of the securing elements 133 project along a longitudinal extent of the transverse bar elements 129 beyond the transverse bar elements 129. The stop surface of the securing elements 133 is aligned in parallel to the main extent surface 110 of the base plate unit 101.

In the present exemplary embodiment, the attachment unit 102 of the setting apparatus 100 includes both the securing elements 133 and also the clamping elements 136 for securing and/or attaching the setting apparatus 100 to the magnet unit 11 (e.g., to the radio-frequency antenna unit 22 of the magnet unit 11). In this way, a redundant attachment and/or securing of the setting apparatus 100 to the magnet unit is achieved. As an alternative to this, however, an embodiment of the setting apparatus 100 includes only the clamping elements 136 or only the securing elements 133 for securing and/or attaching the setting apparatus 100 to the magnet unit.

The clamping elements 136 are thus disposed on opposite side areas of the frame unit 127 and embodied in the shape of hooks. A receiving area of the hook-shaped clamping elements 136 has an opening that points at least partly in the direction of the further clamping element 136. The clamping elements 136 protrude along a longitudinal extent of the longitudinal bar elements 128 beyond the longitudinal bar elements 128. In addition, the clamping elements 136 also protrude along a longitudinal extent of the transverse bar elements 129 beyond the transverse bar elements 129. In addition, the two clamping elements 136 are supported movably on the frame unit 127 along a distance between the two clamping elements 136.

For a synchronous, mirror-symmetrical movement of the two clamping elements 136 during an attachment process of the setting apparatus 100 to the magnet unit 11, the attachment unit 103 has a sliding block guide 138. The sliding block guide 138 is disposed on a side of the frame unit 127 (e.g., of the longitudinal bar element 128 embodied as an aluminum profile strip), facing away from the base plate unit 101. The sliding block guide 138 has two guide elements 139 that are disposed movably in a direction of the distance between the two clamping elements 136. In the end areas of the two guide elements 139, facing away from the other guide element 139 in each case, the clamping elements 136 are disposed. For this purpose, the guide elements 139 each have two slots 140, into which in each case a screw-shaped support element 141 disposed on the aluminum profile rail is supported. The guide elements 139 each have a further slot 142 that is disposed at each end area on the guide element 139 facing away from the clamping element 136. The further slots 142 are at an angle to the direction of the longitudinal extent of the guide elements 139. The angle may be between 70° and 84°. In one embodiment, the further slots 142 are inclined at an angle of between 75° and 80°.

The attachment unit 102 also includes an actuation element 143 having two further guide elements 144. The actuation element 143 is disposed on a central part area of the longitudinal bar element 128 embodied as an aluminum profile strip and is supported movably via a slot in which a guide bolt of the longitudinal bar element 128 is supported. A movement of the actuation element 143 is performed, for example, at right angles to the longitudinal extent of the longitudinal bar elements 128. In addition, the actuation element 143 has a further slot in which a screw head is supported in order to secure a set position of the actuation element 143 on the frame unit 127. The further two guide elements 144 are disposed in an edge area on the actuation element 143 facing towards the two first guide elements 139 of the sliding block guide 138. The two guide elements 144 extend in the form of bars away from the edge area in the direction of the two guide elements 139 of the sliding block guide 138. In addition the two further guide elements 144 are disposed on the actuation element 143 such that the two further guide elements 144 are supported within the further slots 142 of the guide elements 139 of the sliding block guide 138. When the actuation element 143 is moved at right angles to the longitudinal extent of the longitudinal bar elements 128, a movement that is aligned along the longitudinal extent of the longitudinal bar elements 128 is transmitted by the two further guide elements 144 and the slots 142 to the clamping elements 136.

The two clamping elements 136, in a position clamped to the magnet unit 11, are at a minimum distance from one another, and in an open position, are at a maximum distance from one another. In addition, a clamping surface of the clamping elements 136 is provided with a protective layer (e.g., a layer of felt), so that damage to the radio-frequency antenna unit 22 is prevented. The support elements 134 have a support surface in each case, which is also provided with a protective layer (e.g., a layer of felt). The support surface of the support element 134 of a corner area 135 is essentially aligned at right angles to the clamping surface of the clamping element 136 of the corner area 135 (FIG. 7).

The attachment unit 102 has includes further attachment devices 145 that are disposed in the two further corner areas 146 (e.g., in the corner areas of the further longitudinal bar element 128 of the frame unit 127 (FIG. 3)). For attaching and/or arranging the two further attachment devices 145 on the frame unit 127, the attachment unit 102 has two bar-shaped elements 147 each with a Z profile. At a first end area, the bar-shaped elements 147 are each connected to the frame unit 127. In an end area facing away in each case from the frame unit 127, the bar-shaped elements 147 are connected to the further attachment devices 145. The further attachment devices 145 are formed by tensioning elements that make a tensioning connection and/or clamping connection with the magnet unit 11 (e.g., the radio-frequency antenna unit 22). In a direction of an introductory movement of the setting unit 100 on the magnet unit 11 to create the tension connection and/or clamping connection between the tensioning elements and the radio-frequency antenna units 22, stop elements 148 of the attachment unit 102 are disposed before the tensioning elements, so that when the stop elements 148 rest against the radio-frequency antenna unit 22, the setting apparatus 100 assumes a correct position on the magnet unit 11 for the adjustment and/or setting of the attachment position of the attachment element 18.

For setting and/or adjusting the attachment position of the attachment element 18, the setting apparatus 100 is initially attached to the radio-frequency antenna unit 22 by the attachment unit 102. Subsequently, the setting element 115 is disposed on the attachment element 18, and the swing-arm unit 106 is brought into the corresponding position in relation to the base plate unit 101 for setting and/or adjusting the attachment position of the attachment element 18. For setting and/or adjusting the attachment position of the attachment element 18 on the magnet unit 11, the two laser beam units 104 105 are activated, so that both generate a laser beam 114, of which the crossing point marks the correct attachment position for the attachment element 18. Using the laser beam 114 or the crossing point of the two laser beams 114, the attachment position of the attachment element 18 is first marked in an x/y plane of the magnet unit that is aligned in parallel to the main extent surface 110 of the base plate unit 101. The attachment position in a z direction, which is aligned orthogonally to the x/y plane, is marked by the setting element 115. The attachment position of the attachment element 18 in the z direction corresponds to the marked position on the setting element 115 added to a distance of the adjusting element 117 from the receiving area 27 of the attachment element 18 or to a distance between the adjusting element 117 and the plug-in area 116 of the setting element 116.

To match the crossing point with the adjustment element 117 of the setting element 115, the attachment element 18 is moved in at least two spatial directions. For this purpose, the attachment element 18 has slots, in which screw elements are guided so that a variation of a position of a screw element in the corresponding slot causes a change in the position of the attachment element 18 in relation to the magnet unit 11.

In an alternative embodiment of the attachment unit 102, this may also have attachment devices that are embodied for attaching the setting apparatus 100 to a transport rail and/or a slide rail for a transport of the patient support apparatus within the radio-frequency antenna unit 22. In addition, further embodiments of the attachment devices may be provided.

Figure 8:
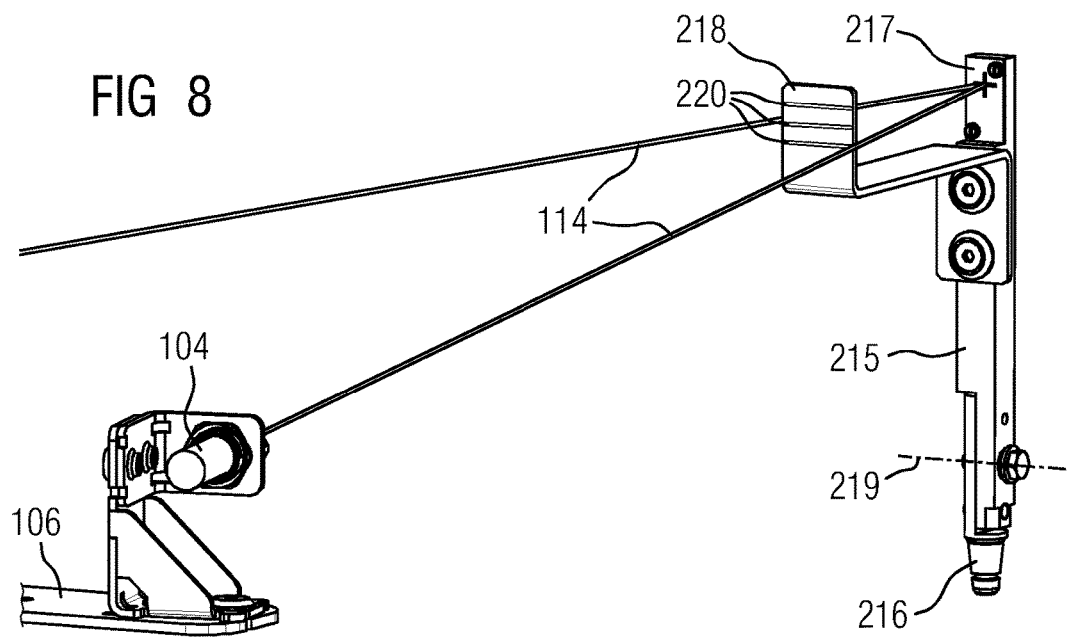
FIG. 8 shows a second exemplary embodiment of the setting element.

FIG. 8 shows an alternate exemplary embodiment of the setting element 215 for a setting and/or adjustment of the attachment position of the attachment element 18 to the magnet unit. The setting element 215 in FIG. 5 differs from the setting element in FIG. 4 with respect to an embodiment of the further adjustment element 218.

The setting element 215 is embodied in the form of a pin and has a plug-in area 216 that is disposed along a longitudinal extent of the setting element 215 in a first end area of the setting element 215. The setting element 215 is disposed on the attachment element 18 using the plug-in area 216 in a receiving area 27 of the attachment element 18. In an end area of the setting element 215 opposite the plug-in area 216, this has a first adjustment element 217. This adjustment element 217 marks a point at which, when the setting element 215 is disposed in a correct attachment position of the attachment element 18, the two laser beams 114 of the laser beam units 104, 105 are to strike each other. The first adjustment element 217 includes a scale indicator that marks a precise striking point for setting and/or adjusting the attachment position of the attachment element 18 on the magnet unit 11. The scale indicator is formed in the present exemplary embodiment by a printed, transparent film and/or a printed paper that is arranged under a transparent film. The adjustment element includes a slot (not shown in any greater detail) that is disposed in a beam direction of the two laser beams 114 behind the scale indicator such that, during the marking of the attachment position, a position of a crossing point of the two laser beams 114 is visible to a user from both sides of the setting element in relation to the scale indicator of the adjustment element 217.

For a correct disposal of the setting element 215 on the attachment element 18 or within a receiving area of the attachment element 18, the setting element 215 has the further adjustment element 218 (FIG. 8). The further adjustment element 218 makes possible a correct alignment of the setting element 215 in relation to the surface spanned by the laser beams 214 of the laser beam units 104, 105 and/or in relation to the main extent surface 110 of the base plate unit 101. The further adjustment element 218 is disposed in a second part area of the setting element 215 and is formed by an L-shaped adjustment element 218. In an end area of the L-shaped adjustment element 218, the L-shaped adjustment element has a marking 220 that in the present exemplary embodiment includes three marking lines.

The setting element 215 has a joint unit 219 for correct setting and/or adjustment of the arrangement on the attachment element 18, which divides the setting element 215 into two part areas along a longitudinal extent. A first part area includes the plug-in element 216 and is disposed on the attachment element 18. A second part area includes the first adjustment element 217 and also the second adjustment element 218. Using the joint unit 219, an inclination may be set between the first part area and the second part area of the setting element 215, until the second part area (e.g., a surface of the second part area including the adjustment element) assumes a correct arrangement at right angles in relation to the main extent surface 110 of the base plate unit 101 and/or of the surface spanned by the two laser beams 114 of the two laser beam units 104, 105. The joint unit 219 in the present exemplary embodiment includes a pivot joint 219. In addition, the pivot joint is set so that a friction force during a rotation is greater than a weight force acting on the second part area, so that an autonomous rotation around an axis of rotation of the joint unit 219 is prevented.

If the laser beams 114 of the two laser beam units 104, 105 are located during the operation of the setting apparatus 100 at a height and/or at a level of the central marking line, then the setting element 215 is disposed in a correct position on the attachment element 18 for the setting and/or adjustment of the attachment position. If the laser beams 114 of the two laser beam units 104, 105 are below or above a height and/or a level of the central marking line during the operation of the setting apparatus 100 (e.g., at the height and/or the level of the lower or upper marking line), then before setting and/or adjustment of the attachment position, the setting element 215 (e.g., the second part area) is to be brought into the correct position by rotating the second part area of the setting element 215 around the axis of rotation of the joint unit 209, until the laser beams 114 are disposed at a height and/or at a level of the central marking line.

As an alternative to the setting element 215 shown in FIG. 8, the further adjustment element 218 may also be provided with just one marking line. The marking line shows a correct position of the setting element 215.

Figure 9:
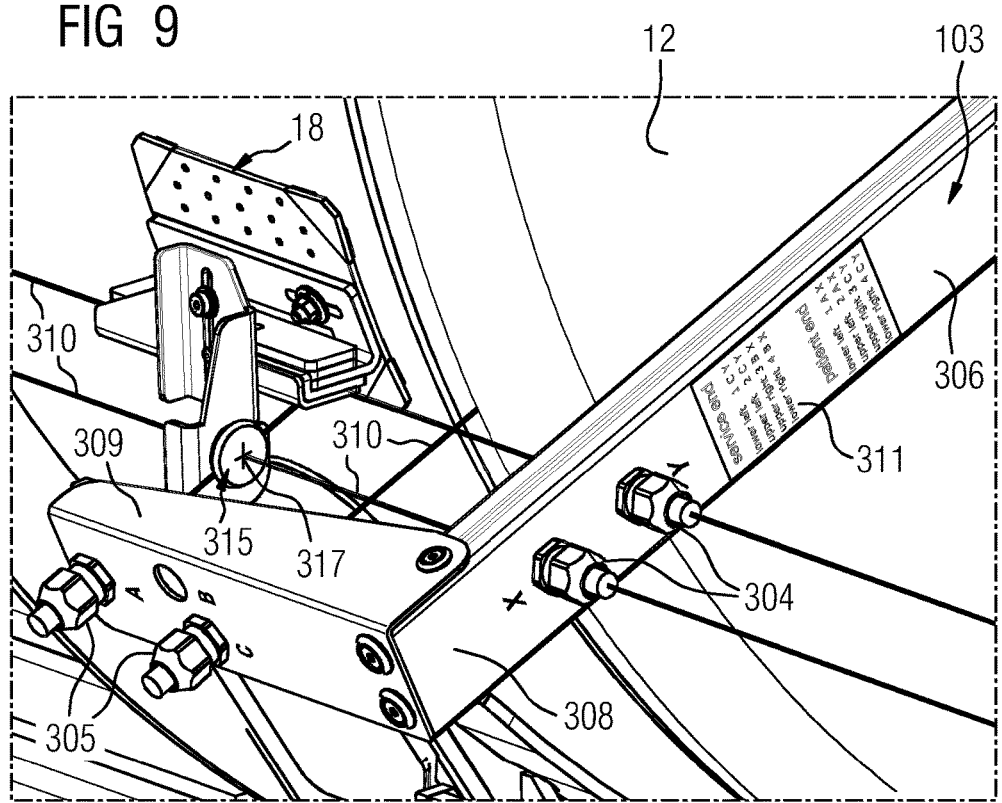
FIG. 9 shows a detailed view of an alternate swing-arm unit with a further alternate setting element of one embodiment of the setting apparatus.

FIG. 9 shows an alternate exemplary embodiment of the swing-arm unit 306 and a further alternate exemplary embodiment of a setting element for a setting and/or adjusting the attachment position of the attachment element 18 on the magnet unit.

The swing-arm unit 306 of the setting unit 102 has a number of laser beam units 304, 305 that are disposed in the same end area 308 along a longitudinal extent of the swing-arm unit 306. In an end area (not shown) of the swing-arm unit 306 facing away from the laser beam units 304, 305, the swing-arm unit 306 is supported rotatably on the base plate unit 101.

To arrange the laser beam elements 304, 305, the swing-arm unit 306 has a web-shaped element 309 that extends out away from the end area 308 facing away from the base plate unit 101 orthogonally to the longitudinal extent of the swing-arm unit 306. The web-shaped element 309 extends away from the swing-arm unit 306 in an installed state of the setting apparatus 100 on the magnet unit 11 in the direction of the magnet unit 11. Two of the laser beam units are disposed next to one another in the end area 308 of the swing-arm unit 306, and two of the laser beam units 305 are disposed next to each other on the web-shaped element 309. The laser beam units 304, 305 are disposed such that, during operation of the laser beam units 304, 305, at least one laser beam 310 of a laser beam unit 304 disposed in the end area 308 of the swing-arm unit 306 and at least one laser beam of a laser beam element 309 have a crossing point. The two laser beams 310 span an adjustment surface that is essentially aligned at right angles to a main extent surface 110 of the base plate unit 101. In addition, a label 311 is attached to the swing-arm unit 306 from which a user may obtain a combination of the different laser beam units 304, 305 for the adjustment and/or setting of the attachment positions of the different attachment elements 18 on the magnet unit 11 (FIG. 9).

A further embodiment of the laser beam units 304, 305 and also the further arrangement of the swing-arm unit 306 on the base plate unit 101 corresponds to the information given for the laser beam units 104, 105 and the swing-arm unit 106 in FIGS. 3 to 7.

The setting apparatus 100 shown in part in FIG. 9 also includes an alternate setting element 315 that is disposed in a receiving area of the attachment element 18 for a setting and/or adjustment of the attachment position of the attachment element 18 for attaching the housing cover 15 to the magnet unit 11. The setting element 315 in the present exemplary embodiment has an optical light channel. The optical light channel is disposed in the attachment position of the attachment element 18 within a beam path of a laser beam 310 of the laser beam unit 305 disposed on the swing-arm unit 306 (e.g., on the web-shaped element 309).

The setting element 315 has an adjustment element 317 that marks a point in the attachment position of the attachment element 18 at which a laser beam 310 of the laser beam unit 304 disposed on the swing-arm unit 306 strikes. The adjustment element 317 may be formed by an adjustment cross stamped and/or milled into the setting element 315. In the present exemplary embodiment, the setting element 315 includes a transparent cover (e.g., made of Plexiglas). The adjustment element 317 is disposed behind the transparent cover in the form of a printed paper, for example. In one embodiment, the transparent cover is printed with an adjustment cross. In this way, visibility of the laser beams 310 of the laser beam units 305 in the area of the setting element 315 (e.g., in the area of the optical light channel) is increased.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A setting apparatus configured for setting, adjusting, or setting and adjusting an attachment position of an attachment element configured for attaching a housing cover of a magnetic resonance apparatus in relation to a magnetic center of a magnet unit, wherein the setting apparatus comprises:
    a base plate unit;
    an attachment unit operable for attaching the base plate unit to the magnet unit, the attachment unit disposed on a first surface of the base plate unit; and
    a setting unit disposed on a second surface of the base plate unit, the second surface opposite and facing away from the first surface of the base plate unit,
    wherein the setting unit comprises at least two laser beam units that are operable for marking the attachment position of the attachment element to facilitate the attachment of the housing cover to the magnet unit,
    wherein the setting unit comprises a swing-arm unit on which at least one laser beam unit of the at least two laser beam units is disposed, and
    wherein the at least two laser beam units are disposed along a longitudinal extent of the swing-arm unit in different end areas of the swing-arm unit.

2. The setting apparatus of claim 1, wherein the swing-arm unit comprises at least one latching element, and the base plate unit comprises at least one latching element that corresponds to the at least one latching element of the swing-arm unit.

3. The setting apparatus of claim 2, wherein the at least one latching element of the base plate unit is disposed on the base plate unit such that the swing-arm unit is aligned in a latching position with the base plate unit so that the at least two laser beam units mark at least one attachment position of the attachment element.

4. The setting unit of claim 1, wherein the at least two laser beam units are disposed on the setting unit such that a first laser beam of a first laser beam unit of the at least two laser beam units, during operation of the setting apparatus, has a common crossing point with a second laser beam of a second laser beam unit of the at least two laser beam units, and
    wherein the common crossing point marks the attachment position of the attachment element.

5. The setting apparatus of claim 1, wherein the at least two laser beam units, together with the crossing point, span a surface that is aligned in parallel with a main extent surface of the base plate unit.

6. The setting apparatus of claim 1, wherein the at least two laser beam units are disposed in a same end area of the swing-arm unit.

7. The setting apparatus of claim 6, wherein the end area of the swing-arm unit comprises a web-shaped element at right angles to a longitudinal extent of the swing-arm unit, on which at least one laser beam unit of the at least two laser beam units is disposed.

8. The setting apparatus of claim 1, wherein the swing-arm unit is disposed removably on the base plate unit.

9. The setting apparatus of claim 1, further comprising at least one setting element that is disposed on the attachment element,
wherein the at least one setting element comprises at least one optical light channel, through which, for an adjustment, a setting, or an adjustment and setting of the attachment position, at least one laser beam of the at least two laser beam units is guided.

10. The setting apparatus of claim 1, wherein the setting unit comprises at least one setting element that, for setting, adjusting, or setting and adjusting the attachment position, is disposed on the attachment element, and
wherein the setting element is configured in the shape of a pin.

11. The setting apparatus of claim 9, wherein the at least one setting element comprises at least one first adjusting element that, in an adjusted state, is disposed within a beam path of at least one laser beam of at least one laser beam unit of the at least two laser beam units, is disposed at a crossing point of laser beams of the at least two laser beam units, or a combination thereof.

12. The setting apparatus of claim 11, wherein the at least one first adjustment element comprises a form, a color, or a form and color that differs from a form, a color, or a form and color of an area of the at least one setting element surrounding the adjustment element.

13. The setting apparatus of claim 9, wherein the at least one setting element comprises at least one plug-in area, and
wherein the at least one plug-in area is disposed on the attachment element of the magnet unit for adjusting the attachment position of the attachment element.

14. The setting apparatus of claim 9, wherein the at least one setting element comprises at least one further adjustment element for a horizontal, vertical, or horizontal and vertical adjustment of the setting element in relation to a surface spanned by laser beams of the at least two laser beam units.

15. The setting apparatus of claim 9, wherein the setting element comprises at least one joint unit for an adjustment, alignment, or adjustment and alignment of the setting element in relation to a surface spanned by one laser beam of the at least two laser beam units.

16. The setting apparatus of claim 1, wherein the base plate unit comprises at least one adjustment element for adjusting, setting, or adjusting and setting a position, a beam direction, or the position and the beam direction of a positioning laser unit of the magnet unit.

17. The setting apparatus of claim 16, wherein the at least one adjustment element comprises at least one adjustment surface, and
wherein the at least one adjustment surface is aligned for adjusting, setting, or adjusting and setting the position, the beam direction, or the position and the beam direction of the at least one positioning laser unit at right angles to a weight force acting on the adjustment element in an installed state of the setting apparatus.

18. The setting apparatus of claim 1, further comprising a further laser beam unit configured for an adjustment, a setting, or an adjustment and setting of a position of a patient support device in relation to the magnet unit.

19. The setting apparatus of claim 18, wherein the further laser beam unit is disposed pivotably on the base plate unit.

20. The setting apparatus of claim 1, wherein the attachment unit comprises at least one frame unit on which the base plate unit is disposed.

21. The setting apparatus of claim 20, wherein the at least one frame unit has a polygonal shape, and
wherein at least one attachment device operable for attaching the setting apparatus to the magnet unit is disposed in at least two corner areas of the frame unit.

22. The setting apparatus of claim 21, wherein the attachment unit comprises at least one attachment device operable for attaching the setting apparatus to the magnet unit in each corner area of the polygonal shape.

23. The setting apparatus of claim 21, wherein the at least one attachment device of the attachment unit comprises at least two attachment devices, each of the at least two attachment devices comprising a clamping element, and
wherein the at least two clamping elements being disposed in opposite side areas of the frame unit.

24. The setting apparatus of claim 23, wherein the attachment unit comprises at least one sliding-block guide operable for transmitting a clamping movement to the at least two clamping elements.

25. The setting apparatus of claim 24, wherein the at least two clamping elements are operable to carry out a clamping movement along a distance between the at least two clamping elements using the at least one sliding-block guide.

26. The setting apparatus of claim 21, wherein the attachment unit comprises at least two securing elements configured for a screw connection between the setting apparatus and the magnet unit.

27. The setting apparatus of claim 20, wherein the attachment unit comprises at least two support elements, each support element of the at least two support elements having a support surface that is disposed at right angles to a clamping surface of a clamping element.

28. The setting apparatus of claim 26, wherein at least one securing element of the at least two securing elements, at least one support element of the attachment unit, or the at least one securing element and the at least one support element are each disposed in a corner area of the frame unit in which one clamping element is disposed.

29. The setting apparatus of claim 21, wherein the attachment unit comprises at least one further attachment device that is disposed in at least one third corner area of the frame unit.

30. A magnetic resonance apparatus comprising:
a magnet unit comprising:
a main magnet;
a gradient coil unit;
a radio-frequency antenna unit; and
at least one attachment element;
a housing cover surrounding the magnet unit; and
a setting apparatus configured for setting, adjusting, or setting and adjusting at least one attachment position of the at least one attachment element configured for attaching the housing cover to the magnet unit, the setting apparatus comprising:
a base plate unit;
an attachment unit operable for attaching the base plate unit to the magnet unit, the attachment unit disposed on a first surface of the base plate unit; and
a setting unit disposed on a second surface of the base plate unit, the second surface opposite and facing away from the first surface of the base plate unit,
wherein the setting unit comprises at least two laser beam units that are operable for marking the attachment position of the at least one attachment element to facilitate the attachment of the housing cover to the magnet unit, wherein the setting unit comprises a swing-arm unit on which at least one laser beam unit of the at least two laser beam units is disposed, and wherein the at least two laser beam units are disposed along a longitudinal extent of the swing-arm unit in different end areas of the swing-arm unit.

31. The magnetic resonance apparatus of claim 30, wherein the least one attachment element comprises at least one setting element operable for setting an attachment position of the at least one attachment element in at least one direction.

\* \* \* \* \*